United States Patent
Goeoetz et al.

(10) Patent No.: US 9,105,874 B2
(45) Date of Patent: Aug. 11, 2015

(54) LIGHT-EMITTING COMPONENTS AND METHOD FOR PRODUCING A LIGHT-EMITTING COMPONENT

(75) Inventors: Britta Goeoetz, Regensburg (DE); Erwin Lang, Regensburg (DE); Thilo Reusch, Regensburg (DE); Daniel Steffen Setz, Boeblingen (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/131,690

(22) PCT Filed: May 31, 2012

(86) PCT No.: PCT/EP2012/060210
§ 371 (c)(1),
(2), (4) Date: Jan. 9, 2014

(87) PCT Pub. No.: WO2013/007443
PCT Pub. Date: Jan. 17, 2013

(65) Prior Publication Data
US 2014/0138662 A1    May 22, 2014

(30) Foreign Application Priority Data

Jul. 13, 2011   (DE) .......................... 10 2011 079 048

(51) Int. Cl.
*H01J 1/62* (2006.01)
*H01L 51/52* (2006.01)
*H01L 51/56* (2006.01)

(52) U.S. Cl.
CPC .......... *H01L 51/5268* (2013.01); *H01L 51/529* (2013.01); *H01L 51/56* (2013.01); *H01L 51/5265* (2013.01); *H01L 51/5271* (2013.01); *H01L 2251/558* (2013.01)

(58) Field of Classification Search
CPC . H01L 51/50; H01L 51/5008; H01L 51/5203; H01L 51/5268
USPC ........................................ 313/506; 257/79, 99
See application file for complete search history.

(56) References Cited

U.S. PATENT DOCUMENTS

| 6,396,864 B1 | 5/2002 | O'Brien et al. |
| 6,965,197 B2 | 11/2005 | Tyan et al. |
| 7,049,745 B2 * | 5/2006 | Cok .............................. 313/512 |

(Continued)

FOREIGN PATENT DOCUMENTS

| DE | 102008019900 A1 | 8/2009 |
| DE | 102008031405 A1 | 1/2010 |
| DE | 102008048472 A1 | 3/2010 |
| DE | 102009024411.5 A1 | 9/2010 |
| EP | 1406474 A1 | 4/2004 |

OTHER PUBLICATIONS

English language abstract of DE 102008031405 A1 dated Jan. 7, 2010.

(Continued)

*Primary Examiner* — David Vu
*Assistant Examiner* — Brandon Fox

(57) ABSTRACT

A light-emitting component may include: a first electrode; an organic electroluminescent layer structure on or over the first electrode; a second translucent electrode on or over the organic electroluminescent layer structure; and a mirror layer structure on or over the second electrode, wherein the mirror layer structure has a lateral thermal conductance of at least $1*10^{-3}$ W/K.

15 Claims, 8 Drawing Sheets

(56) References Cited

U.S. PATENT DOCUMENTS

| | | | |
|---|---|---|---|
| 7,982,396 B2* | 7/2011 | Cok | 313/506 |
| 2002/0043929 A1 | 4/2002 | Tazawa | |
| 2005/0110396 A1 | 5/2005 | Cok | |
| 2005/0285518 A1 | 12/2005 | Cok | |
| 2005/0285520 A1 | 12/2005 | Cok | |
| 2006/0125387 A1 | 6/2006 | Adachi et al. | |
| 2007/0222371 A1* | 9/2007 | Raychaudhuri et al. | 313/504 |
| 2010/0187987 A1 | 7/2010 | Nakamura | |

OTHER PUBLICATIONS

English language abstract of DE 102008048472 A1 dated Mar. 25, 2010.

English language abstract of DE 102008019900 A1 dated Aug. 6, 2009.

International Search Report issued for PCT/EP2012/060210 on Oct. 26, 2012.

* cited by examiner

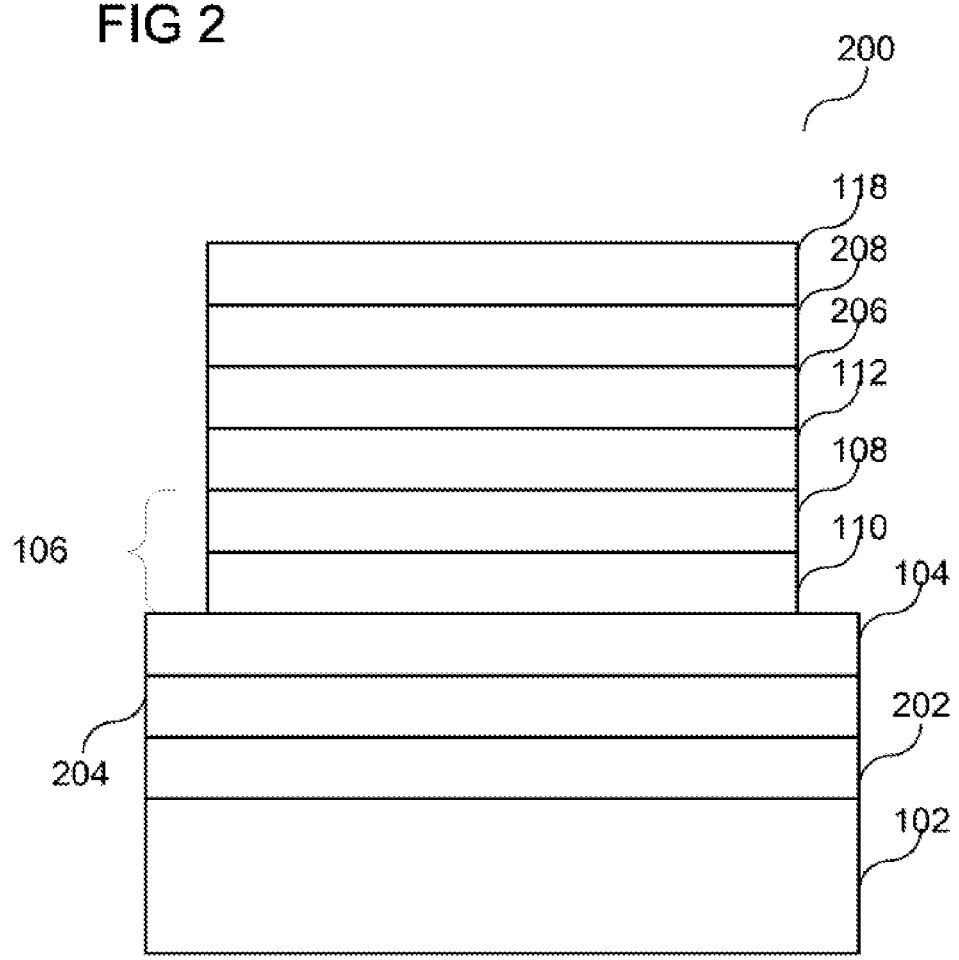

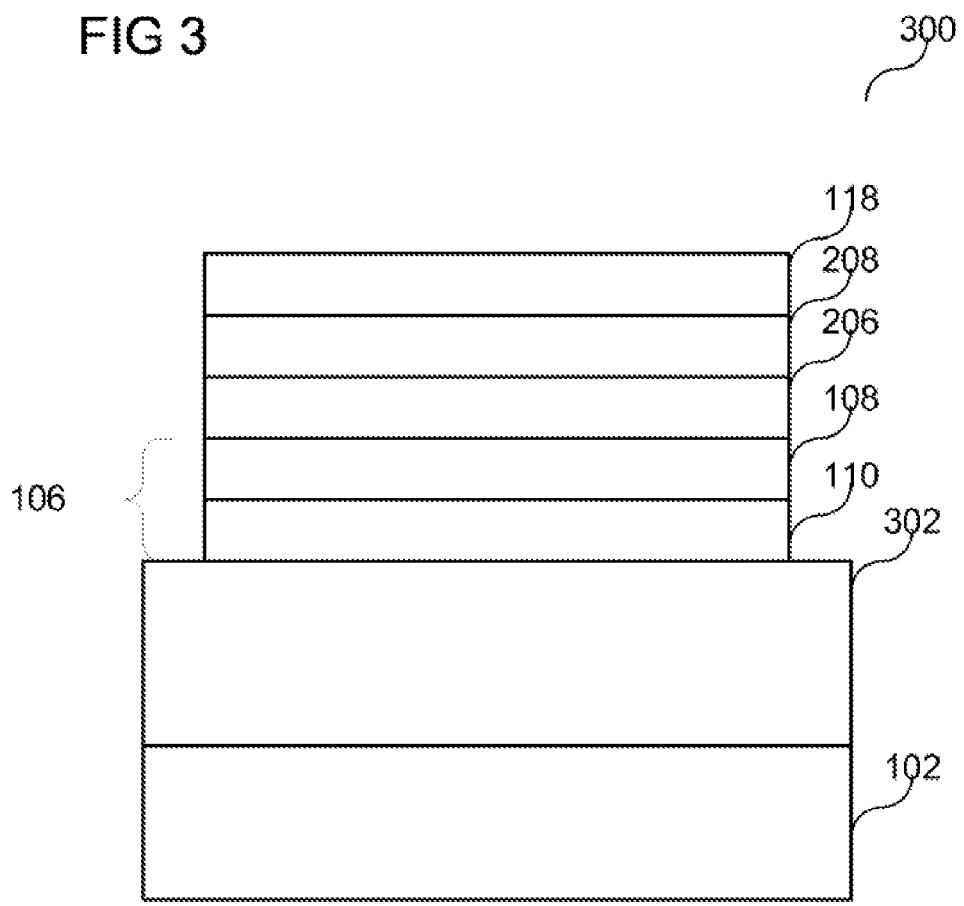

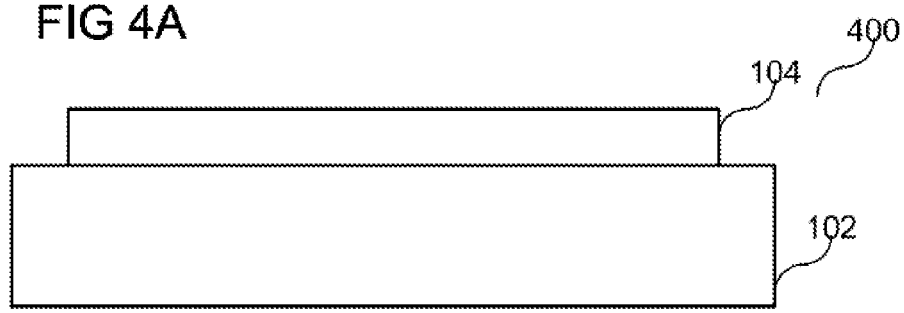
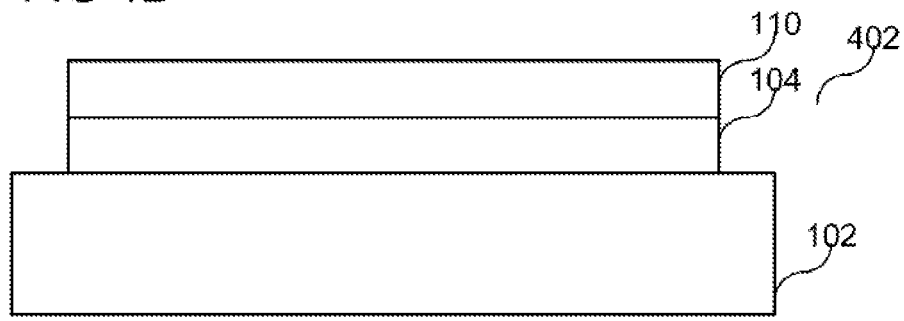
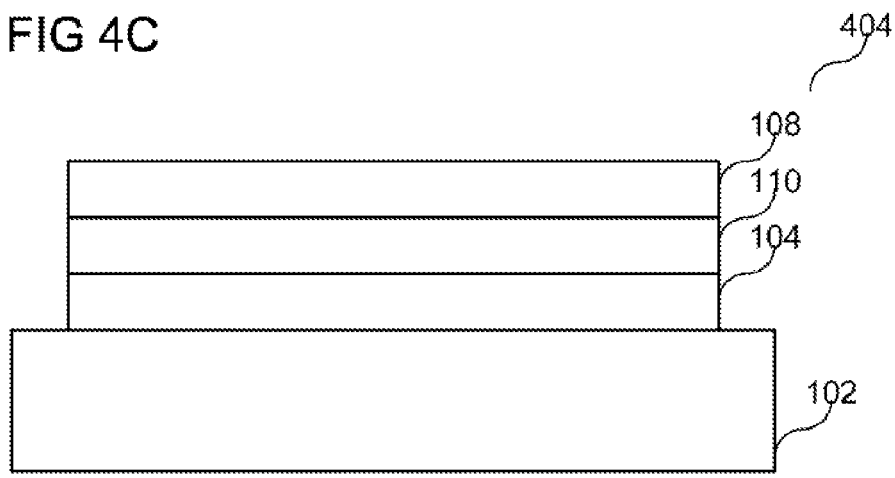

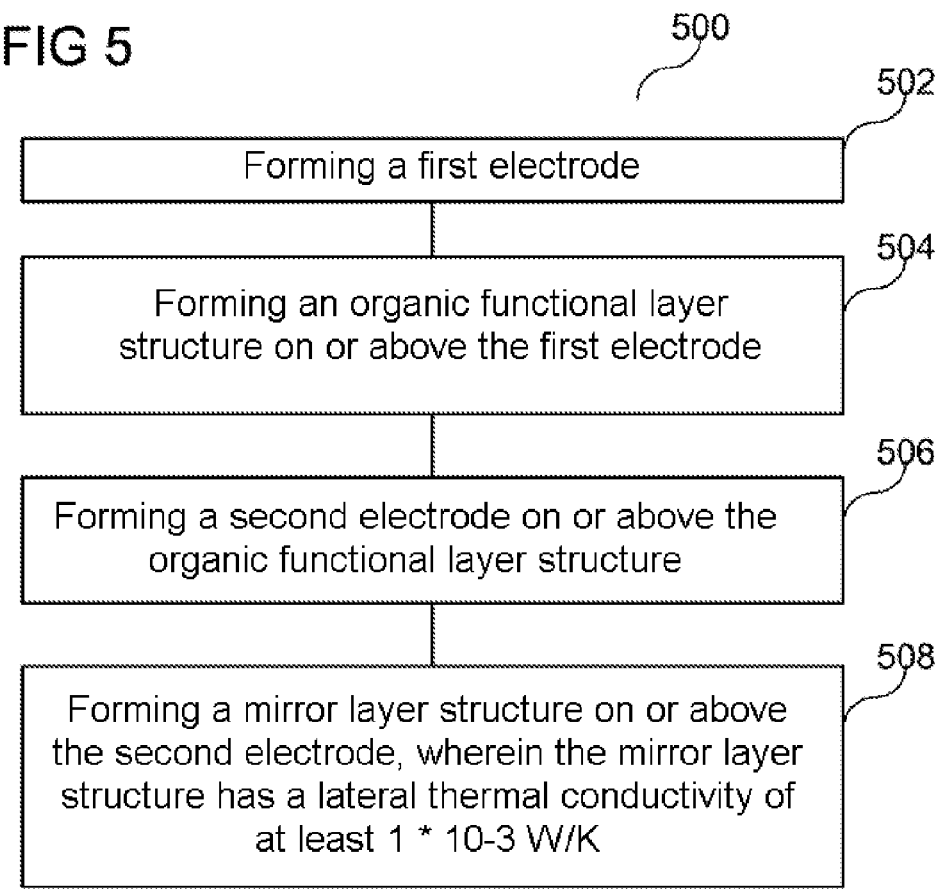

LIGHT-EMITTING COMPONENTS AND METHOD FOR PRODUCING A LIGHT-EMITTING COMPONENT

RELATED APPLICATIONS

The present application is a national stage entry according to 35 U.S.C. §371 of PCT application No.: PCT/EP2012/060210 filed on May 31, 2012, which claims priority from German application No.: 10 2011 079 048.9 filed on Jul. 13, 2011, and is incorporated herein by reference in its entirety.

TECHNICAL FIELD

Various embodiments relate to light-emitting components and methods for producing a light-emitting component.

BACKGROUND

On large-area organic light-emitting diodes (OLEDs) a significant unequal distribution of temperature and luminance usually occurs. The unequal distribution results firstly in an unattractive luminous image. Secondly, brightness and temperature peaks bring about an intensified aging of individual regions of the luminous area of the OLED. A more uniform temperature distribution may improve the homogeneity of the luminous image and increase the lifetime of the OLED.

As a result of microcavity effects, OLEDs have a color shift in the emitted light over the viewing angle. Said color shift is undesirable from a product standpoint.

The OLEDs commercially available at the present time (for example the OLEDs having the designation ORBEOS from Osram) do not as yet contain any device for compensating for lateral temperature gradients. If appropriate, the design of a conventional OLED has recourse to so-called busbars, which primarily provide for a more uniform current distribution and, as a secondary effect, bring about a slight improvement in the lateral temperature distribution, although this is insufficient.

Furthermore, in an organic light-emitting diode a component architecture with heat dissipation via radiation is known, consisting of a thermal contact layer, a metal plate and a radiation layer (Cok et al., Journal of the SID 13/10, 2005, pages 849 et seq.).

In order to combat the aspect of color angle distortion in an OLED, approaches pursued hitherto include applying scattering films or scattering foils, optimizing the layer sequence of the OLED and increasing the optical transparency of the bottom contact.

Furthermore, in the case of an organic light-emitting diode, for the purpose of reducing the color angle distortion, it is known to provide a combination of a semitransparent top contact and a mirror applied at the rear side (also designated as remote cavity) (Proc Int Disp Workshops—Vol. 11, "White Multi-Photon Emission OLED without optical interference", pages 1293 to 1296 (2004)).

SUMMARY

Various embodiments provide a light-emitting component. The light-emitting component may include a first electrode; an organic electroluminescent layer structure on or over the first electrode; a second electrode on or over the organic electroluminescent layer structure; and a mirror layer structure on or over the second electrode, wherein the mirror layer structure has a lateral thermal conductance of at least $1*10^{-3}$ W/K. In various embodiments, a lateral thermal conductance of a layer is understood to mean the product of specific thermal conductivity of the layer material and layer thickness. If the mirror layer structure consists of a plurality of layers, then in various embodiments the lateral thermal conductance is the sum of the individual lateral thermal conductances.

In one configuration, the light-emitting component may furthermore include an optically translucent layer structure on or over the second electrode. The mirror layer structure may be arranged on or over the optically translucent layer structure.

In various embodiments, the term "translucent" or "translucent layer" may be understood to mean that a layer is transmissive to light, for example to the light generated by the light-emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" may be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments "transparent" should be regarded as a special case of "translucent".

For the case where, for example, a light-emitting monochromatic or emission spectrum-limited electronic component is intended to be provided, it suffices for the optically translucent layer structure to be translucent at least in a partial range of the wavelength range of the desired monochromatic light or for the limited emission spectrum.

In one configuration, the second electrode may be designed in such a way that the optically translucent layer structure is optically coupled to the organic electroluminescent layer structure.

In various embodiments, by way of example, only the respective electrode (for example first electrode and/or the second electrode, for example the cathode) is provided as an electrode formed as semitransparent.

Even if the concept of the "remote cavity" is known per se, in various embodiments, illustratively a mirror layer structure having a sufficiently high lateral thermal conductance is provided in order to improve the heat distribution in a light-emitting component, for example an OLED. In various embodiments, the combination of the optical function of the translucent layer and mirror layer structure with the advantages of the lateral heat distribution in a common layer structure is provided in comparison with the prior art.

Various embodiments provide a light-emitting component. The light-emitting component may include a mirror layer structure having a lateral thermal conductance of at least $1*10^{-3}$ W/K; an organic electroluminescent layer structure on or over the mirror layer structure; and an electrode on or over the organic electroluminescent layer structure.

In one configuration, the mirror layer structure can form a first electrode; and the electrode may form a second electrode.

In another configuration, the light-emitting component may furthermore include a first electrode, arranged on or over the mirror layer structure. The electrode can form a second electrode.

In another configuration, the light-emitting component may furthermore include a first optically translucent layer structure between the mirror layer structure and the first electrode.

The first optically translucent layer structure may include light-scattering particles.

In another configuration, the light-emitting component may furthermore include an encapsulation layer structure on or over the second electrode.

In another configuration, the light-emitting component may furthermore include a second optically translucent layer structure on or over the second electrode.

The second optically translucent layer structure may include light-scattering particles.

In another configuration, the mirror layer structure may have a layer thickness of at least 1 μm.

Various embodiments provide a method for producing a light-emitting component. The method may include forming a first electrode; forming an organic electroluminescent layer structure on or over the first electrode; forming a second electrode on or over the organic electroluminescent layer structure; and forming a mirror layer structure on or over the second electrode, wherein the mirror layer structure has a lateral thermal conductance of at least $1*10^{-3}$ W/K.

In one configuration, the method may furthermore include forming an optically translucent layer structure on or over the second electrode. The mirror layer structure may be formed on or over the optically translucent layer structure.

Various embodiments provide a method for producing a light-emitting component. The method may include forming a mirror layer structure having a lateral thermal conductance of at least $1*10^{-3}$ W/K; forming an organic electroluminescent layer structure on or over the mirror layer structure; and forming an electrode on or over the organic electroluminescent layer structure.

In one configuration, the mirror layer structure may form a first electrode and the electrode may form a second electrode.

In another configuration, the method may furthermore include forming a first electrode, arranged on or over the mirror layer structure. The electrode may form a second electrode.

In another configuration, the method may furthermore include forming a first optically translucent layer structure between the mirror layer structure and the first electrode.

In another configuration, the first optically translucent layer structure may contain light-scattering particles or the first optically translucent layer structure can be formed thereby.

In another configuration, the method may furthermore include forming an encapsulation layer structure on or over the second electrode.

In another configuration, the method may furthermore include forming a second optically translucent layer structure on or over the second electrode.

In another configuration, light-scattering particles may be contained or formed in the second optically translucent layer structure.

In another configuration, the mirror layer structure may be formed with a layer thickness of at least 1 μm.

In another configuration, the light-emitting component may be designed as an organic light-emitting diode or as an organic light-emitting transistor.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 2 shows a cross-sectional view of a light-emitting component in accordance with various embodiments;

FIG. 3 shows a cross-sectional view of a light-emitting component in accordance with various embodiments;

FIGS. 4A to 4F show a light-emitting component in accordance with various embodiments at different points in time during the production of said component;

FIG. 5 shows a flow chart illustrating a method for producing a light-emitting component in accordance with various embodiments.

DETAILED DESCRIPTION

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, a light-emitting component can be embodied as an organic light-emitting diode (OLED), or as an organic light-emitting transistor. In various embodiments, the light-emitting component can be part of an integrated circuit. Furthermore, a plurality of light-emitting components can be provided, for example in a manner accommodated in a common housing.

In various embodiments, illustratively in the case of a light-emitting component, for example an organic light-emitting diode (OLED), a back-side mirror is used for (lateral) heat distribution.

Figure 1:
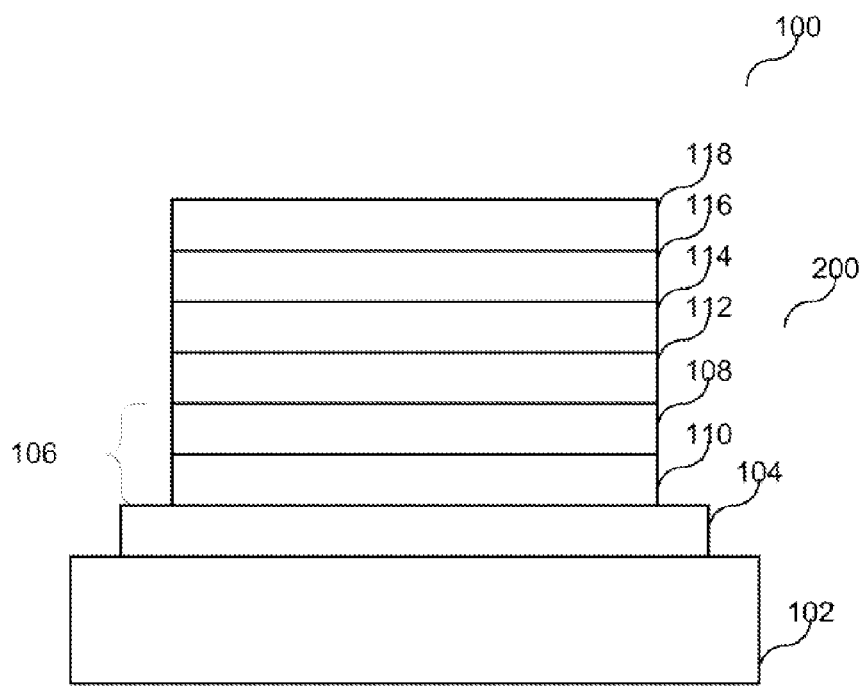
FIG. 1 shows a cross-sectional view of a light-emitting component in accordance with various embodiments.

FIG. 1 shows an organic light-emitting diode 100 as an implementation of a light-emitting component in accordance with various embodiments.

The light-emitting component 100 in the form of an organic light-emitting diode 100 may have a substrate 102. The substrate 102 may serve for example as a carrier element for electronic elements or layers, for example light-emitting elements. By way of example, the substrate 102 may include or be formed from glass, quartz, and/or a semiconductor material or any other suitable material. Furthermore, the substrate 102 may include or be formed from a plastic film or a laminate including one or a plurality of plastic films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyether sulfone (PES) and/or polyethylene naphthalate (PEN). Furthermore, the substrate 102 may include for example a metal film, for example an aluminum film, a high-grade steel film, a copper film or a combination or a layer stack thereof. The substrate 102 may include one or more of the materials mentioned above. The substrate 102 can be embodied as translucent.

In various embodiments, the organic light-emitting diode may be designed as a so-called top emitter and/or as a so-called bottom emitter. In various embodiments, a top emitter may be understood to be an organic light-emitting diode in which the light is emitted from the organic light-emitting diode toward the top, for example through the second electrode. In various embodiments, a bottom emitter may be understood to be an organic light-emitting diode in which the light is emitted from the organic light-emitting diode toward the bottom, for example through the substrate and the first electrode.

A first electrode 104 (for example in the form of a first electrode layer 104) may be applied on or over the substrate 102. The first electrode 104 (also designated hereinafter as bottom electrode 104) may be formed from an electrically conductive material, such as, for example, a metal or a transparent conductive oxide (TCO) or a layer stack including a plurality of layers of the same or different metal or metals and/or the same or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_2$, $ZnSnO_2$, $MgIn_2O_4$, $GaInO_2$, $Zn_2In_2O_5$ or $In_4Sn_3O_{12}$, or mixtures of different transparent conductive oxides also belong to the group of TCOs. Furthermore, the TCOs do not necessarily correspond to a stoichiometric composition and can furthermore be p-doped or n-doped.

In various embodiments, the first electrode 104 may include a metal; for example Ag, Pt, Au, Mg, Al, Ba, In, Ag, Au, Mg, Ca, Sm or Li, and compounds, combinations or alloys of these materials.

In various embodiments, the first electrode 104 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In various embodiments, the first electrode can provide one or a plurality of the following materials as an alternative or in addition to the above-mentioned materials: networks composed of metallic nanowires and nanoparticles, for example composed of Ag; networks composed of carbon nanotubes; graphene particles and graphene layers; networks composed of semiconducting nanowires.

Furthermore, said electrodes may include conductive polymers or transition metal oxides or transparent conductive oxides.

For the case where the light-emitting component 100 emits light through the substrate, the first electrode 104 and the substrate 102 can be formed as translucent or transparent. In this case, for the case where the first electrode 104 is formed from a metal, the first electrode 104 can have for example a layer thickness of less than or equal to approximately 25 nm, for example a layer thickness of less than or equal to approximately 20 nm, for example a layer thickness of less than or equal to approximately 18 nm. Furthermore, the first electrode 104 can have for example a layer thickness of greater than or equal to approximately 10 nm, for example a layer thickness of greater than or equal to approximately 15 nm. In various embodiments, the first electrode 104 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case of a translucent or transparent first electrode 104 and for the case where the first electrode 104 is formed from a transparent conductive oxide (TCO), the first electrode 104 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case of a translucent or transparent first electrode 104 and for the case where the first electrode 104 is formed from, for example, a network composed of metallic nanowires, for example composed of Ag, which can be combined with conductive polymers, a network composed of carbon nanotubes which can be combined with conductive polymers, or from graphene layers and composites, the first electrode 104 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

For the case where the light-emitting component 100 emits light exclusively toward the top, the first electrode 104 can also be designed as opaque or reflective. In this case, the first electrode 104 can have a layer thickness of greater than or equal to approximately 40 nm, for example a layer thickness of greater than or equal to approximately 50 nm.

The first electrode 104 may be formed as an anode, that is to say as a hole-injecting electrode, or as a cathode, that is to say electron-injecting.

The first electrode 104 may have a first electrical terminal, to which a first electrical potential (provided by an energy store (not illustrated) (for example a current source or a voltage source) may be applied. Alternatively, the first electrical potential can be applied to the substrate 102 and then be fed indirectly to the first electrode 104 via said substrate. The first electrical potential may be, for example, the ground potential or some other predefined reference potential.

Furthermore, the light-emitting component 100 may have an organic electroluminescent layer structure 106, which is applied on or over the first electrode 104.

The organic electroluminescent layer structure 106 may contain one or a plurality of emitter layers 108, for example including fluorescent and/or phosphorescent emitters, and one or a plurality of hole-conducting layers 110. In various embodiments, electron-conducting layers (not illustrated) can alternatively or additionally be provided.

Examples of emitter materials which may be used in the light-emitting component 100 in accordance with various embodiments for the emitter layer(s) 108 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl-(2-carboxypyridyl)iridium III), green phosphorescent Ir (ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]ruthenium (III) complex) and blue fluorescent DPAVBi (4,4-bis[4-(di-p-tolylamino)styryl]biphenyl), green fluorescent TTPA (9,10-bis[N,N-di-(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of wet-chemical methods such as spin coating, for example.

The emitter materials may be embedded in a matrix material in a suitable manner.

It should be pointed out that other suitable emitter materials are likewise provided in other embodiments.

The emitter materials of the emitter layer(s) 108 of the light-emitting component 100 can be selected for example such that the light-emitting component 100 emits white light. The emitter layer(s) 108 may include a plurality of emitter materials that emit in different colors (for example blue and yellow or blue, green and red); alternatively, the emitter layer(s) 108 can also be constructed from a plurality of partial layers, such as a blue fluorescent emitter layer 108 or blue phosphorescent emitter layer 108, a green phosphorescent emitter layer 108 and a red phosphorescent emitter layer 108. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic electroluminescent layer structure 106 may generally include one or a plurality of electroluminescent layers. The one or the plurality of electroluminescent layers may include organic polymers, organic oligomers, organic monomers, organic small, non-polymeric molecules ("small molecules") or a combination of these materials. By way of example, the organic electroluminescent layer structure 106 may include one or a plurality of electroluminescent layers embodied as a hole transport layer 110, so as to enable for example in the case of an OLED an effective hole injection into an electroluminescent layer or an electroluminescent region. Alternatively, in various embodiments, the organic electroluminescent layer structure may include one or a plurality of functional layers embodied as an electron transport layer, so as to enable for example in the case of an OLED an effective electron injection into an electroluminescent layer or an electroluminescent region. By way of example, tertiary amines, carbazo derivatives, conductive polyaniline or polyethylene dioxythiophene may be used as material for the hole transport layer 110. In various embodiments, the one or the plurality of electroluminescent layers may be embodied as an electroluminescent layer.

In various embodiments, the hole transport layer 110 may be applied, for example deposited, on or over the first electrode 104, and the emitter layer 108 may be applied, for example deposited, on or over the hole transport layer 110.

In various embodiments, the organic electroluminescent layer structure 106 (that is to say for example the sum of the thicknesses of hole transport layer(s) 110 and emitter layer(s) 108) may have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 106 may have for example a stack of a plurality of organic light-emitting diodes (OLEDs) arranged directly one above another, wherein each OLED may have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 106 may have for example a stack of three or four OLEDs arranged directly one above another, in which case for example the organic electroluminescent layer structure 106 may have a layer thickness of a maximum of approximately 3 µm.

The light-emitting component 100 may optionally generally include further organic functional layers, for example arranged on or over the one or the plurality of emitter layers 108, which serve to further improve the functionality and thus the efficiency of the light-emitting component 100.

A second electrode 112 (for example in the form of a second electrode layer 112) may be applied on or over the organic electroluminescent layer structure 106 or, if appropriate, on or over the one or the plurality of further organic functional layers.

In various embodiments, the second electrode 112 may include or be formed from the same materials as the first electrode 104, metals being particularly suitable in various embodiments.

In various embodiments, the second electrode 112 may have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 112 may generally be formed in a similar manner to the first electrode 104, or differently than the latter. In various embodiments, the second electrode 112 may be formed from one or more of the materials and with the respective layer thickness (depending on whether the second electrode is intended to be formed as reflective, translucent or transparent) as described above in connection with the first electrode 104.

In the case of these layer thicknesses, the additional cavity, explained in even greater detail below, is optically coupled to the microcavity (microcavities) formed by the one or the plurality of electroluminescent layer structures.

The second electrode 112 may be formed as an anode, that is to say as a hole-injecting electrode, or as a cathode, that is to say electron-injecting.

The second electrode 112 may have a second electrical terminal, to which a second electrical potential (which is different than the first electrical potential), provided by the energy source, may be applied. The second electrical potential may have for example a value such that the difference with respect to the first electrical potential has a value in a range of approximately 1.5 V to approximately 20 V, for example a value in a range of approximately 2.5 V to approximately 15 V, for example a value in a range of approximately 5 V to approximately 10 V.

An optically translucent layer structure 114 may be provided on or over the second electrode 112. The optically translucent layer structure 114 may optionally include additional light-scattering particles.

The optically translucent layer structure 114 may be formed from an arbitrary material, in principle, for example a dielectric material, for example an organic material, which forms an organic matrix, for example.

In various embodiments, the optically translucent layer structure 114 is translucent, for example transparent, to radiation at least in a partial range of the wavelength range of 380 nm to 780 nm.

In various embodiments, a mirror layer structure 116 is applied on or over the optically translucent layer structure 114. Illustratively, the optically translucent layer structure 114 and the mirror layer structure 116 jointly form a cavity, for example microcavity, optically coupled (that is to say illustratively external) to the microcavity of the light-emitting component 100, for example the OLED, for example having one optically active medium or a plurality of optically active media.

In various embodiments, the mirror layer structure 116 has a layer thickness of at least 1 µm. Furthermore, the mirror layer structure 116 may have a lateral thermal conductance of at least $1*10^{-3}$ W/K.

For this purpose for example in this embodiment the optically translucent layer structure 114 of the "external" cavity is brought into contact with the translucent (transparent or semitransparent) second electrode 112 of the OLED microcavity. The "external" cavity does not participate or participates only insignificantly in the current transport through the OLED; to put it another way, no or only a negligibly small electric current flows through the "external" cavity and thus through the optically translucent layer structure 114 and the mirror layer structure 116.

As already set out above, the "external" cavity, and in this case in particular the optically translucent layer structure 114, in various embodiments, may be "filled" with a suitable organic matrix or be formed by such. The "external" cavity may have two mirrors or mirror layer structures 116, at least one of which is translucent, transparent or semitransparent. The translucent, transparent or semitransparent mirror (or the translucent, transparent or semitransparent mirror layer structure) may be identical to the translucent, transparent or semitransparent second electrode 112 of the OLED microcavity (these embodiments are illustrated in the figures; in alternative embodiments, however, an additional translucent, transparent or semitransparent mirror layer structure may also be provided between the second electrode 112 and the optically translucent layer structure 114).

In various embodiments, low molecular weight organic compounds ("small molecules") may be provided as material for the organic matrix, and may be applied for example by means of vapor deposition in vacuo, such as alpha-NPD or 1-TNATA, for example. In alternative embodiments, the organic matrix may be formed from or consist of polymeric materials which for example form an optically transparent polymeric matrix (epoxides, polymethyl methacrylate, PMMA, EVA, polyester, polyurethanes, or the like) and may be applied by means of a wet-chemical method (for example spin coating or printing). In addition, these materials may contain additives for adapting the refractive index. In various embodiments, for example any organic material such as may also be used in the organic electroluminescent layer structure 106 may be used for the organic matrix. Furthermore, in alternative embodiments, the optically translucent layer structure 114 may include or be formed by an inorganic semiconductor material, for example SiN, $SiO_2$, GaN, etc., which for example by means of a low-temperature deposition method (for example from the gas phase) (i.e. for example at a temperature of less than or equal to approximately 100° C.). In various embodiments, the refractive indices of the OLED functional layers 106, 108, 110 and of the optically translucent layer structure 114 may be adapted to one another as much as possible, wherein the optically translucent layer structure 114 may also include high refractive index polymers, for example polyimides having a refractive index of up to n=1.7, or polyurethane having a refractive index of up to n=1.74.

In various embodiments, additives may be provided in the polymers. Therefore, illustratively, a high refractive index polymer matrix may be achieved by mixing suitable additives into a polymeric matrix having a normal refractive index. Suitable additives are, for example, titanium oxide or zirconium oxide nanoparticles or compounds including titanium oxide or zirconium oxide.

In various embodiments, between the second translucent electrode 112 and the optically translucent layer structure 114 an electrically insulating layer may also be applied, for example SiN, for example having a layer thickness in a range of approximately 30 nm to approximately 1.5 µm, for example having a layer thickness in a range of approximately 200 nm to approximately 1 µm, in order to protect electrically unstable materials, for example during a wet-chemical process.

In various embodiments, a barrier thin-film layer/thin-film encapsulation may optionally also be formed.

In the context of this application, a "barrier thin-film layer" or a "barrier thin film" can be understood to mean, for example, a layer or a layer structure which is suitable for forming a barrier against chemical impurities or atmospheric substances, in particular against water (moisture) and oxygen. In other words, the barrier thin-film layer is formed in such a way that OLED-damaging substances such as water, oxygen or solvent cannot penetrate through it or at most very small proportions of said substances can penetrate through it. Suitable configurations of the barrier thin-film layer can be found for example in the patent applications DE 10 2009 014 543, DE 10 2008 031 405, DE 10 2008 048 472 and DE 2008 019 900.

In accordance with one configuration, the barrier thin-film layer may be formed as an individual layer (to put it another way, as a single layer). In accordance with an alternative configuration, the barrier thin-film layer may include a plurality of partial layers formed one on top of another. In other words, in accordance with one configuration, the barrier thin-film layer can be formed as a layer stack. The barrier thin-film layer or one or a plurality of partial layers of the barrier thin-film layer may be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer having a plurality of partial layers, all the partial layers may be formed by means of an atomic layer deposition method. A layer sequence including only ALD layers can also be designated as a "nanolaminate".

In accordance with an alternative configuration, in the case of a barrier thin-film layer including a plurality of partial layers, one or a plurality of partial layers of the barrier thin-film layer may be deposited by means of a different deposition method than an atomic layer deposition method, for example by means of a vapor deposition method.

In accordance with one configuration, the barrier thin-film layer may have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer includes a plurality of partial layers, all the partial layers may have the same layer thickness. In accordance with another configuration, the individual partial layers of the barrier thin-film layer may have different layer thicknesses. In other words, at least one of the partial layers may have a different layer thickness than one or more other partial layers.

In accordance with one configuration, the barrier thin-film layer or the individual partial layers of the barrier thin-film layer may be formed as a translucent or transparent layer. In other words, the barrier thin-film layer (or the individual partial layers of the barrier thin-film layer) may consist of a translucent or transparent material (or a material combination that is translucent or transparent).

In accordance with one configuration, the barrier thin-film layer or (in the case of a layer stack having a plurality of partial layers) one or a plurality of the partial layers of the barrier thin-film layer may include or consist of one of the following materials: aluminum oxide, zinc oxide, zirconium oxide, titanium oxide, hafnium oxide, tantalum oxide, lanthanium oxide, silicon oxide, silicon nitride, silicon oxynitride, indium tin oxide, indium zinc oxide, aluminum-doped zinc oxide, and mixtures and alloys thereof.

In various embodiments, the optically translucent layer structure 114 may have a layer thickness in a range of approximately 10 nm to approximately 200 μm, for example a layer thickness in a range of approximately 100 nm to approximately 100 μm, for example a layer thickness in a range of approximately 500 nm to approximately 50 μm, for example 1 μm to 25 μm.

In various embodiments, the optically translucent layer structure 114 may furthermore include an adhesive or be formed therefrom, wherein the adhesive can optionally also contain additional scattering particles. In various embodiments, the optically translucent layer structure 114 (for example the layer composed of adhesive) may have a layer thickness of greater than 1 μm, for example a layer thickness of several μm.

In various embodiments, between the second electrode 112 and the optically translucent layer structure 114 an electrically insulating layer may also be applied, for example SiN, for example having a layer thickness in a range of approximately 300 nm to approximately 1.5 μm, for example having a layer thickness in a range of approximately 500 nm to approximately 1 μm, in order to protect electrically unstable materials, for example during a wet-chemical process.

One possible advantage of this arrangement, which in various embodiments also forms the "external" cavity in the front-end-of-line processes, compared with a cavity applied by means of a back-end-of-line process on the outside of the inherently completed light-emitting component, can be seen in the strong optical coupling of the optically translucent layer structure 114 to the plasmons in the OLED bottom contact (for example the first electrode 104) or in the OLED top contact (for example the second electrode 112).

In various embodiments, the mirror layer structure 116 (or, if appropriate, the mirror layer structure that can be provided on or over the second translucent electrode 112 below the optically translucent layer structure 114), for the case of a desired high transmissivity, may include one or a plurality of thin metal films (for example Ag, Mg, Sm, Ca, and multilayers and alloys of these materials). The one or the plurality of metal films can have (in each case) a layer thickness in a range of approximately 10 nm to approximately 70 nm, for example a layer thickness in a range of approximately 14 nm to approximately 30 nm, for example a layer thickness in a range of approximately 15 nm to approximately 25 nm. For this case it is possible to use all those materials for the mirror layer structure 116 (or, if appropriate, the mirror layer structure that can be provided on or over the second electrode 112 below the optically translucent layer structure 114) such as have been mentioned above for the second translucent electrode 112. In this regard, by way of example, it is also possible to provide doped metal-oxidic compounds, such as ITO, IZO or AZO, which can be deposited by means of a low-damage deposition technology such as by means of "facial target sputtering", for example.

In various embodiments, the mirror layer structure 116 (or, if appropriate, the mirror layer structure that can be provided on or over the second translucent electrode 112 below the optically translucent layer structure 114) can be reflective or translucent or transparent or semitransparent, depending on whether the organic light-emitting diode 100 is formed as a top emitter and/or as a bottom emitter. The materials can be selected from the materials such as have been mentioned above for the first electrode. The layer thicknesses, too, depending on the desired embodiment of the organic light-emitting diode 100, can be chosen in the ranges such as have been described above for the first electrode. Alternatively or additionally, the mirror layer structure 116 (or, if appropriate, the mirror layer structure that can be provided on or over the second translucent electrode 112 below the optically translucent layer structure 114) can have one or a plurality of dielectric mirrors.

For this case it is possible to use all those materials for the mirror layer structure 116 (or, if appropriate, the mirror layer structure that can be provided on or over the second electrode 112 below the optically translucent layer structure 114) such as have been mentioned above for the second electrode 112. In this regard, by way of example, it is also possible to provide doped metal-oxidic compounds, such as ITO, IZO or AZO, which can be deposited by means of a low-damage deposition technology such as by means of "facial target sputtering", for example.

In various embodiments, the mirror layer structure 116 can have the desired minimum lateral thermal conductance through suitable selection of the materials of the mirror layer structure 116 and/or the layer thickness of the individual layers of the mirror layer structure 116 or the entire mirror layer structure 116.

By way of example, the mirror layer structure 116 can have a stack of a plurality of different metals having the same or having different layer thicknesses. In this regard, by way of example, the mirror layer structure 116 may include a layer composed of copper having a layer thickness in a range of approximately 10 nm to approximately 70 nm, for example having a layer thickness in a range of approximately 14 nm to approximately 30 nm, for example having a layer thickness in a range of approximately 15 nm to approximately 25 nm, and additionally a layer composed of aluminum having a layer thickness in a range of approximately 10 nm to approximately 70 nm, for example having a layer thickness in a range of approximately 14 nm to approximately 30 nm, for example having a layer thickness in a range of approximately 15 nm to approximately 25 nm. In various embodiments, the mirror layer structure 116 may include a layer composed of copper having a layer thickness of approximately 3 µm and additionally a layer composed of aluminum having a layer thickness of approximately 5 µm. In various embodiments, the mirror layer structure 116 may include a layer composed of aluminum having a layer thickness of approximately 2 µm and additionally a layer composed of silver having a layer thickness of approximately 5 µm. In various embodiments, the mirror layer structure 116 may include a layer composed of copper having a layer thickness of approximately 3 µm and additionally a layer composed of silver having a layer thickness of approximately 2 µm.

The mirror layer structure 116 can have one or a plurality of mirrors. If the mirror layer structure 116 has a plurality of mirrors, then the respective mirrors are separated from one another by means of a respective dielectric layer.

The one or the plurality of metal films of the mirror layer structure 116 can have (in each case) a layer thickness in a range of approximately 2 nm to approximately 1 mm, for example a layer thickness in a range of approximately 200 nm to approximately 100 µm, for example a layer thickness in a range of approximately 1 µm to approximately 10 µm.

Furthermore, the organic light-emitting diode 100 can also have encapsulation layers, which can be applied for example in the context of a back-end-of-line process, wherein it should be pointed out that in various embodiments the external cavity is formed in the context of the front-end-of-line process.

Furthermore, a cover layer 118, for example a glass 118, can optionally be applied on or over the mirror layer structure 116.

Various embodiments provide a simplified construction and a front-end-of-line process for a light-emitting component, for example an OLED, with an improved, for example optimized (for example lateral) temperature distribution and an improved viewing angle dependence. In various embodiments, this is achieved for example by using a transparent or semitransparent top contact (also designated as second electrode) and/or, if appropriate, a thin-film encapsulation of the light-emitting component, for example of the OLED. Furthermore, this can be achieved alternatively or additionally by means of the lamination of a back-side mirror having a high reflectivity and high thermal conductance by means of an optically translucent, for example optically transparent, adhesive. The adhesive used can be, for example, epoxides, polymethyl methacrylate, PMMA, EVA, polyester, polyurethanes, phenol-formaldehyde resin adhesives, silicones, silane-crosslinking polymer adhesives, polyimide adhesives; these adhesives may additionally include additives for adapting the refractive index.

In various embodiments, the light is emitted through the optically translucent, for example optically transparent, bottom contact (also designated as first electrode) of the light-emitting component, for example of the OLED (in this case, the light-emitting component is designed as a "bottom emitter".

The back-side mirror, i.e. generally the mirror layer structure (for example the mirror layer structure 116), may, in the simplest case, include or consist of a glass plate which was vapor-deposited with a metal of sufficient layer thickness (for example of a layer thickness of at least 1 µm).

In various embodiments, metals can be used such as, for example, Ag, Al or one or a plurality of metal alloys having a combination of high reflectivity and high thermal conductance.

In various embodiments, by means of one or a plurality of additional dielectric layers in the mirror layer structure the reflectivity of the mirror layer structure (for example of the back-side mirror) can be increased and the corrosion thereof can be suppressed.

Additional layers for improving the adhesion and/or the processability can be provided in various embodiments.

The translucent, for example transparent, top contact on the light-emitting component, for example the OLED, may include or consist of thin metal layers (for example Ag, Cu, Au, Sm, Ca, Ba, Mg, or alloys thereof) or translucent, for example transparent, electrically conductive metal oxides (ITO, AZO, etc.) or a combination of the two (so-called TCO-thin metal-TCO, such as ITO-Ag-ITO, for example).

The mirror layer structure together with the adhesive and the translucent, for example transparent, top contact of the OLED can form a passive (not operated electrically) external optical cavity.

By coupling the external optical cavity to the OLED cavity, it is possible to improve the color angle distortion of such an OLED.

Lateral temperature gradients in the light-emitting component, for example in the OLED, are compensated for by the thermal conductivity of the mirror layer structure.

In various embodiments, light-scattering particles can also be embedded into the layer of the adhesive (also designated as adhesive layer), which particles can lead to a further improvement in the color angle distortion and the coupling-out efficiency. In various embodiments, the light-scattering particles provided can be, for example, dielectric scattering particles such as, for example, metal oxides such as e.g. silicon oxide ($SiO_2$), zinc oxide (ZnO), zirconium oxide ($ZrO_2$), indium tin oxide (ITO) or indium zinc oxide (IZO), gallium oxide ($Ga_2O_a$), aluminum oxide, or titanium oxide. Other particles may also be suitable, provided that they have a refractive index that differs from the effective refractive index of the matrix of the translucent layer structure, for example air bubbles, acrylate, or hollow glass beads. Furthermore, for example metallic nanoparticles, metals such as gold, silver, iron nanoparticles, or the like can be provided as light-scattering particles.

FIG. 2 shows an organic light-emitting diode 200 as an implementation of a light-emitting component in accordance with various embodiments.

The organic light-emitting diode 200 in accordance with FIG. 2 is identical in many aspects to the organic light-emitting diode 100 in accordance with FIG. 1, for which reason only the differences between the organic light-emitting diode 200 in accordance with FIG. 2 and the organic light-emitting diode 100 in accordance with FIG. 1 are explained in greater detail below; with regard to the remaining elements of the organic light-emitting diode 200 in accordance with FIG. 2, reference is made to the above explanations concerning the organic light-emitting diode 100 in accordance with FIG. 1.

In contrast to the organic light-emitting diode 100 in accordance with FIG. 1, in the case of the organic light-emitting diode 200 in accordance with FIG. 2, the mirror layer structure 202 and the optically translucent layer structure 204 are not formed on or over the second electrode 112, but rather below the first electrode 104.

In these embodiments, the energy source is connected to the first electrical terminal of the first electrode 104 and to the second electrical terminal of the second electrode 112.

The organic light-emitting diode 200 in accordance with FIG. 2 can be formed as a top emitter.

In various embodiments, the organic light-emitting diode 200 in accordance with FIG. 2 is illustratively a surface emitting OLED with a "remote" cavity approach on the substrate side. In this embodiment, both contacts (i.e. the first electrode 104 and the second electrode 112) are semitranslucent, for example semitransparent.

Furthermore, in the organic light-emitting diode 200 in accordance with FIG. 2, an encapsulation layer structure 206, for example in the form of a thin-film encapsulation 206, is arranged on or over the second electrode 112. Furthermore, a layer 208 composed of an adhesive (optionally including additional light-scattering particles) can on or over the encapsulation layer structure 206, for example a second optically translucent layer structure 208 on or over the second electrode 112.

Furthermore, a cover layer 118, for example a glass 118, can optionally be applied on or over the second optically translucent layer structure 208.

Therefore, the light-emitting component that emits on the substrate side (for example the OLED that emits on the substrate side) in various embodiments is transferred to a light-emitting component that emits on the surface side (for example an OLED that emits on the surface side), as illustrated in FIG. 2 or FIG. 3. In this case, the external metal mirror can be arranged below the optically translucent, for example transparent, bottom contact. In this case, the light leaves the OLED for example through the optically translucent, for example transparent, top contact (for example the second electrode) and is therefore designed for example as a top emitter.

The arrangement of the mirror layer structure, for example of the metal mirror, can be effected in various ways, for example in one of the following ways:
1) Applying a sufficiently thick mirror layer structure, for example metal layer, and, if appropriate, one or a plurality of dielectric auxiliary layers to the underside of the substrate.
2) Adhesively bonding a mirror layer structure, for example a metal foil, on to the underside of the substrate.
3) Vapor-depositing a sufficiently thick mirror layer structure, for example a sufficiently thick metal mirror, on to the substrate, applying a thick optically translucent, for example transparent, layer or layer structure, followed by depositing the optically translucent, for example transparent, bottom contact of the light-emitting component, for example the OLED. The thick optically translucent, for example transparent, layer or layer structure should have the smoothest possible surface. For this reason, various embodiments can provide for depositing a thick SiN layer by means of a CVD process (CVD: chemical vapor deposition). This layer can have the additional advantage that it has a very high refractive index (for example approximately n=1.8), as a result of which the effect of the external passive cavity is intensified still further.

In the case of the processes in accordance with 1.) and 2.) the mirror layer structure together with the substrate and the optically translucent, for example transparent, bottom contact of the OLED forms the external passive cavity.

In a limiting case in which the external passive cavity is extremely thin or even disappears, the thick mirror layer structure, for example the thick metal mirror, can be applied directly to the substrate and simultaneously form the lower contact, i.e. the first electrode 302 of the light-emitting component 300, for example of an OLED 300. Such a light-emitting component 300 is illustrated in FIG. 3.

The rest of the layer stack of the light-emitting component 300 in accordance with FIG. 3 is identical to the layer stack of the light-emitting component 200 in accordance with FIG. 2.

FIG. 4A to FIG. 4F show the light-emitting component 100 in accordance with various embodiments at different points in time during the production of said component. The other light-emitting components 200, 300 can be produced in a corresponding manner.

FIG. 4A shows the light-emitting component 100 at a first point in time 400 during the production of said component.

At this point in time, the first electrode 104 is applied to the substrate 102, for example deposited onto said substrate, for example by means of a CVD method (chemical vapor deposition) or by means of a PVD method (physical vapor deposition, for example sputtering, ion-assisted deposition method or thermal evaporation), alternatively by means of a plating method; a dip coating method; a spin coating method; printing; blade coating; or spraying.

In various embodiments, a plasma enhanced chemical vapor deposition (PE-CVD) method can be used as CVD method. In this case, a plasma can be generated in a volume above and/or around the element to which the layer to be applied is intended to be applied, wherein at least two gaseous starting compounds are fed to the volume, said compounds being ionized in the plasma and excited to react with one another. The generation of the plasma can make it possible that the temperature to which the surface of the element is to be heated in order to make it possible to produce the dielectric layer, for example, can be reduced in comparison with a plasmaless CVD method. That may be advantageous, for example, if the element, for example the light-emitting electronic component to be formed, would be damaged at a temperature above a maximum temperature. The maximum temperature may be approximately 120° C. for example in the case of a light-emitting electronic component to be formed in accordance with various embodiments, such that the temperature at which the dielectric layer for example is applied may be less than or equal to 120° C. and for example less than or equal to 80° C.

FIG. 4B shows the light-emitting component 100 at a second point in time 402 during the production of said component.

At this point in time, the one or the plurality of hole-conducting layers 110 is or are applied to the first electrode 104, for example deposited onto said first electrode, for example by means of a CVD method (chemical vapor deposition) or by means of a PVD method (physical vapor deposition, for example sputtering, ion-assisted deposition method or thermal evaporation), alternatively by means of a plating method; a dip coating method; a spin coating method; printing; blade coating; or spraying.

FIG. 4C shows the light-emitting component 100 at a third point in time 404 during the production of said component.

At this point in time, the one or the plurality of emitter layers 108 is or are applied to the one or the plurality of hole-conducting layers 110, for example deposited onto said hole-conducting layer(s), for example by means of a CVD method (chemical vapor deposition) or by means of a PVD method (physical vapor deposition, for example sputtering, ion-assisted deposition method or thermal evaporation), alternatively by means of a plating method; a dip coating method; a spin coating method; printing; blade coating; or spraying.

Figure 4D:
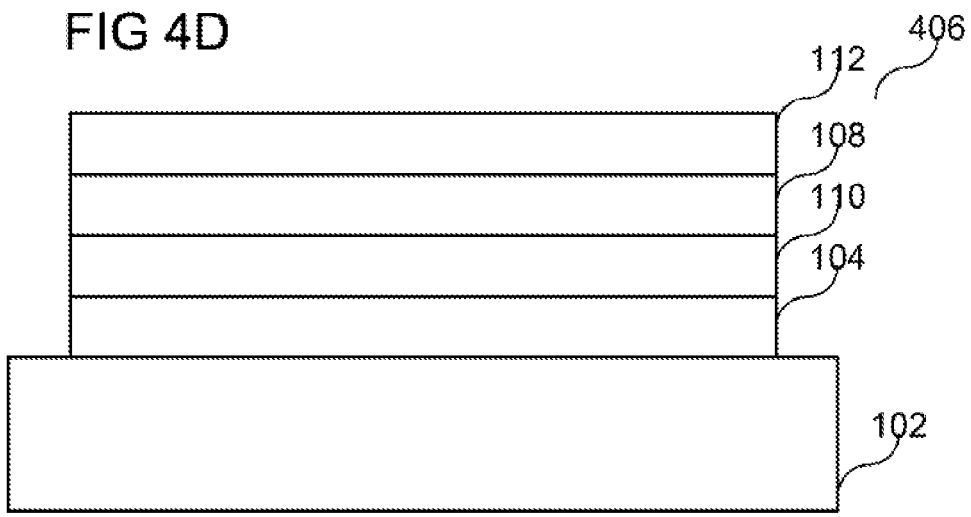

FIG. 4D shows the light-emitting component 100 at a fourth point in time 406 during the production of said component.

At this point in time, the second electrode 112 is applied to the one or the plurality of further organic functional layers (if present) or to the one or the plurality of emitter layers 108, for example deposited onto said layer(s), for example by means of a CVD method (chemical vapor deposition) or by means of a PVD method (physical vapor deposition, for example sputtering, ion-assisted deposition method or thermal evaporation), alternatively by means of a plating method; a dip coating method; a spin coating method; printing; blade coating; or spraying.

Figure 4E:
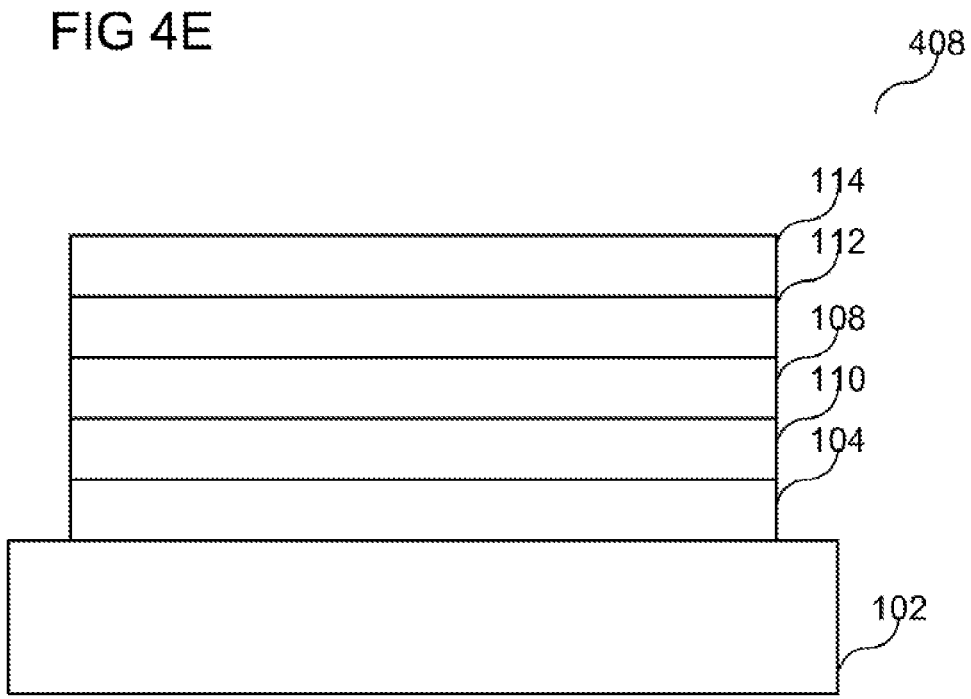

FIG. 4E shows the light-emitting component 100 at a fifth point in time 408 during the production of said component.

At this point in time, the optically translucent layer structure 114 is applied to the second electrode 112, for example by means of a CVD method (chemical vapor deposition) or by means of a PVD method (physical vapor deposition, for example sputtering, ion-assisted deposition method or thermal evaporation), alternatively by means of a plating method; a dip coating method; a spin coating method; printing; blade coating; or spraying.

Figure 4F:
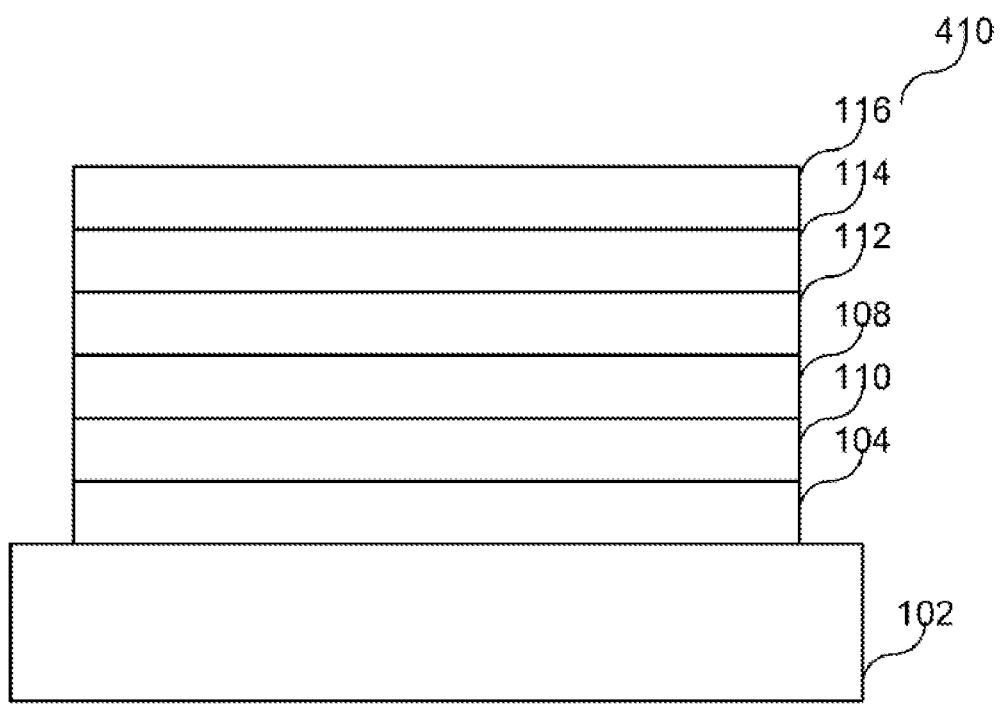

FIG. 4F shows the light-emitting component 100 at a sixth point in time 410 during the production of said component.

At this point in time, the mirror layer structure 116 having the lateral thermal conductance described above is applied to the optically translucent layer structure 114, for example by means of a CVD method (chemical vapor deposition) or by means of a PVD method (physical vapor deposition, for example sputtering, ion-assisted deposition method or thermal evaporation), alternatively by means of a plating method; a dip coating method; a spin coating method; printing; blade coating; or spraying.

The cover layer 118 is then also optionally applied, whereby the light-emitting component 100 in accordance with FIG. 1 is completed.

FIG. 5 shows a flow chart 500 illustrating a method for producing a light-emitting component in accordance with various embodiments.

In various embodiments, in 502 a first electrode is formed, for example on or over a substrate.

Furthermore, in 504 an organic electroluminescent layer structure is formed on or over the first electrode, and in 506 a second translucent electrode is formed on or over the organic electroluminescent layer structure. Furthermore, in 508 a mirror layer structure is formed on or over the second electrode, wherein the mirror layer structure has a lateral thermal conductance of at least $1*10^{-3}$ W/K.

Figure 6:
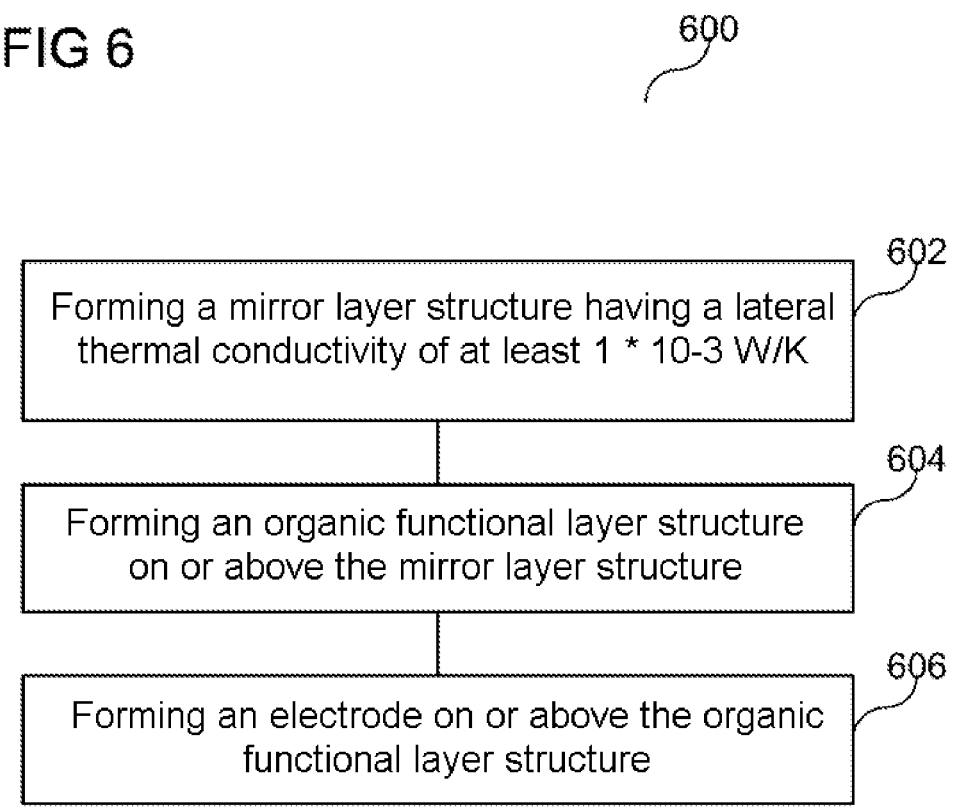
FIG. 6 shows a flow chart illustrating a method for producing a light-emitting component in accordance with various embodiments.

FIG. 6 shows a flow chart 600 illustrating a method for producing a light-emitting component in accordance with various embodiments.

In various embodiments, in 602 a mirror layer structure having a lateral thermal conductance of at least $1*10^{-3}$ W/K is formed. Furthermore, in 604 an organic electroluminescent layer structure is formed on or over the mirror layer structure. In 606, an electrode can be formed on or over the organic electroluminescent layer structure.

One advantage of various embodiments can be seen in the possibility of a simple process that simultaneously improves, for example optimizes, the viewing angle dependence of the emission color and also the heat distribution within the light-emitting component, for example the OLED.

By applying the mirror layer structure (which illustratively can also be designated as heat distribution layer) (in various embodiments for example the Ag, Al mirrors) to the back-side glass, it is possible to avoid the heat input into the OLED for example during direct vapor deposition of a thick aluminum cathode.

In various embodiments, the adhesive may include or be a lamination adhesive. In various embodiments, light-scattering particles can be introduced into the adhesive.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A light-emitting component, comprising:
 a first electrode;
 an organic electroluminescent layer structure on or over the first electrode;
 a second translucent electrode on or over the organic electroluminescent layer structure;
 a mirror layer structure on or over the second electrode, wherein the mirror layer structure has a lateral thermal conductance of at least $1*10^{-3}$ W/K;
 optically translucent layer structure between the second translucent electrode and the mirror layer structure; and
 a second optically translucent layer structure, wherein the first electrode is on or over the second optically translucent layer structure.

2. The light-emitting component as claimed in claim 1, wherein the mirror layer structure forms the second electrode.

3. The light-emitting component as claimed in claim 1, wherein the optically translucent layer structures comprises scattering particles.

4. The light-emitting component as claimed in claim 1, further comprising:
 an encapsulation layer structure on or over the second electrode and/or below the first electrode.

5. The light-emitting component as claimed in claim 1, wherein the mirror layer structure has a layer thickness of at least 1 μm.

6. A light-emitting component, comprising:
 a mirror layer structure having a lateral thermal conductance of at least $1*10^{-3}$ W/K;
 a first translucent electrode;
 an organic electroluminescent layer structure on or over the mirror layer structure;
 a second electrode on or over the organic electroluminescent layer structure; and
 an optically translucent layer structure between the mirror layer structure and the first translucent electrode; and a second optically translucent layer structure on or over the second electrode.

7. The light-emitting component as claimed in claim 6, wherein the mirror layer structure forms a first electrode.

8. The light-emitting component as claimed in claim 6, wherein the second optically translucent layer structure comprises light-scattering particles.

9. The light-emitting component as claimed in claim 6, wherein the optically translucent layer structures comprises scattering particles.

10. The light-emitting component as claimed in claim 6, further comprising:
    an encapsulation layer structure on or over the second electrode and/or below the first electrode.

11. The light-emitting component as claimed in claim 6, further comprising:
    a second optically translucent layer structure on or over the second electrode.

12. The light-emitting component as claimed in claim 11, wherein the second optically translucent layer structure comprises light-scattering particles.

13. The light-emitting component as claimed in claim 6, wherein the mirror layer structure has a layer thickness of at least 1 μm.

14. A method for producing a light-emitting component, the method comprising:
    forming a first electrode on a optically translucent layer structure;
    forming an organic electroluminescent layer structure on or over the first electrode;
    forming a second translucent electrode on or over the organic electroluminescent layer structure;
    forming a second optically translucent layer structure on or over the second translucent electrode; and
    forming a mirror layer structure on or over the second electrode, wherein the mirror layer structure has a lateral thermal conductance of at least $1*10^{-3}$ W/K, wherein the mirror layer structure is formed on or over the second optically translucent layer structure.

15. A method for producing a light-emitting component, the method comprising:
    forming a mirror layer structure having a lateral thermal conductance of at least $1*10^{-3}$ W/K;
    forming an optically translucent layer structure on or over the mirror layer structure;
    forming a first translucent electrode, wherein the first translucent electrode is formed on or over the optically translucent layer structure;
    forming an organic electroluminescent layer structure on or over the mirror layer structure;
    forming a second electrode on or over the organic electroluminescent layer structure; and
    forming a second optically translucent layer structure on or over the second electrode.

* * * * *

UNITED STATES PATENT AND TRADEMARK OFFICE
CERTIFICATE OF CORRECTION

PATENT NO. : 9,105,874 B2  
APPLICATION NO. : 14/131690  
DATED : August 11, 2015  
INVENTOR(S) : Britta Goeoetz et al.

Page 1 of 1

It is certified that error appears in the above-identified patent and that said Letters Patent is hereby corrected as shown below:

In the specification,

Column 5, line 41: Please delete "$CdSnO_2$," in front of "$ZnSnO_2$" and write "$CdSnO_3$," in place thereof.

Column 5, line 41: Please delete "$ZnSnO_2$," between "$CdSnO_2$," and "$MgIn_2O_4$", and write "$ZnSnO_3$," in place thereof.

Column 5, line 41: Please delete "$GaInO_2$," between "$MgIn_2O_4$," and "$Zn_2In_2O_5$", and write "$GaInO_3$," in place thereof.

Signed and Sealed this  
Nineteenth Day of January, 2016

Michelle K. Lee  
*Director of the United States Patent and Trademark Office*